United States Patent
Bajkowski et al.

(10) Patent No.: US 7,362,134 B2
(45) Date of Patent: Apr. 22, 2008

(54) CIRCUIT AND METHOD FOR LATCH BYPASS

(75) Inventors: Maciej Bajkowski, Austin, TX (US); George P. Hoekstra, Austin, TX (US); Prashant U. Kenkare, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 11/388,921

(22) Filed: Mar. 24, 2006

(65) Prior Publication Data

US 2007/0222480 A1 Sep. 27, 2007

(51) Int. Cl.
*H03K 19/20* (2006.01)
(52) U.S. Cl. .......................... 326/46; 326/104; 327/407
(58) Field of Classification Search ................ 326/104, 326/105, 106, 108, 46; 327/407
See application file for complete search history.

(56) References Cited

U.S. PATENT DOCUMENTS

| | | | | |
|---|---|---|---|---|
| 4,314,164 A | * | 2/1982 | Tin et al. ....................... 327/19 |
| 5,357,146 A | * | 10/1994 | Heimann ..................... 327/292 |
| 6,198,700 B1 | * | 3/2001 | Sassoon ...................... 368/113 |
| 6,525,565 B2 | * | 2/2003 | Young et al. .................. 326/46 |
| 6,587,996 B1 | | 7/2003 | Reohr, Jr. et al. |
| 6,697,929 B1 | | 2/2004 | Cherkauer et al. |
| 7,161,390 B2 | * | 1/2007 | Aipperspach et al. ........ 326/121 |
| 2004/0128604 A1 | | 7/2004 | Guettaf |

* cited by examiner

*Primary Examiner*—Rexford Barnie
*Assistant Examiner*—Thienvu V Tran

(57) ABSTRACT

A device includes a first combinatorial logic stage having a first input to receive a first data value, a second input to receive a bypass value and an output to provide one of a representation of the first data value or a first predetermined value based on the bypass value. The device further includes a latch stage having a first input to receive a second data value, a second input to receive the bypass value and an output to provide one of a latched representation of the second data value or a second predetermined value based on the bypass value. The device additionally includes a second combinatorial logic stage having a first input coupled to the output of the first combinatorial logic stage, a second input coupled to the output of the latch stage, and an output.

20 Claims, 4 Drawing Sheets

CIRCUIT AND METHOD FOR LATCH BYPASS

FIELD OF THE DISCLOSURE

The present disclosure is related generally to electronic devices and more specifically to latching data in electronic devices.

BACKGROUND

Many conventional electronic devices utilize a testing scheme for circuit components coupled to a memory. Because the contents of the memory may be unknown during the testing process and therefore may result in spurious test results, test data typically is input to the data path at the output of the memory via a test data source. Thus, conventional testing schemes typically are implemented by using a multiplexer to select between the latched output of the memory and the test data. However, the data path from the output of the memory typically is a critical path during normal operation and introduction of the additional logic gates of the multiplexer directly into this critical path typically introduces an undesirable delay in this critical path. Accordingly, an improved technique for bypassing a latch would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
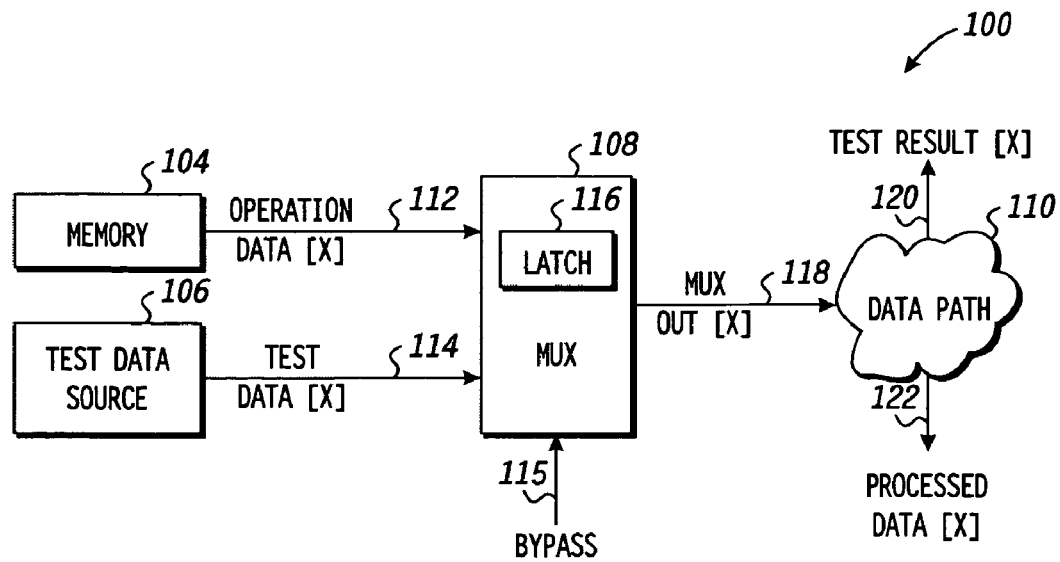
FIG. 1 is a block diagram illustrating an exemplary system for multiplexing latched operation data and test data downstream of a memory component in accordance with at least one embodiment of the present disclosure.

In accordance with one aspect of the present disclosure, a device includes a first combinatorial logic stage having a first input to receive a first data value, a second input to receive a bypass value and an output to provide one of a representation of the first data value or a first predetermined value based on the bypass value. The device further includes a latch stage having a first input to receive a second data value, a second input to receive the bypass value and an output to provide one of a latched representation of the second data value or a second predetermined value based on the bypass value. The device additionally includes a second combinatorial logic stage having a first input coupled to the output of the first combinatorial logic stage, a second input coupled to the output of the latch stage, and an output.

In one embodiment, the latch stage comprises a NOR logic stage having a first input to receive the bypass value, a second input to receive a representation of the second data value, and an output. The latch stage further comprises an inverter logic stage having an input coupled to the output of the NOR logic stage and an output coupled to the second input of the NOR logic stage and the second input of the second combinatorial logic stage.

In another embodiment, the latch stage includes a first voltage reference, a second voltage reference, and a first transistor having a first current-carrying electrode coupled to the first voltage reference, a second current-carrying electrode coupled to a first node, and a control electrode to receive a clock signal. The latch stage further includes a second transistor having a first current-carrying electrode coupled to the first voltage reference, a second current-carrying electrode coupled to the first node, and a control electrode to receive a representation of the bypass value, and a third transistor having a first current-carrying electrode coupled to the first node, a second current-carrying electrode coupled to a second node and a control electrode to receive the second data value. The latch stage additionally includes a fourth transistor having a first current-carrying electrode coupled to the second voltage reference, a second current carrying electrode coupled to the second node and a control electrode to receive the second data value. The latch stage further includes a first inverter stage having an input coupled to the second node and an output and a second inverter stage having an input coupled to the output of the first inverter stage and an output coupled to the second node. The second node comprises the output of the latch stage.

In accordance with another aspect of the present disclosure, a method includes receiving, at a first combinatorial logic stage, a first data value and a bypass value, and receiving, at a latch stage, a second data value and the bypass value. The method further includes providing, at an output of the first combinatorial logic stage, a first output value comprising one of a representation of the first data value or a first predetermined value based on the bypass value. The method additionally includes providing, at an output of the latch stage, a second output value comprising one of a latched representation of the second data value or a second predetermined value based on the bypass value. The method also includes receiving, at a second combinatorial logic stage, the first output value and the second output value, and providing, at an output of the second combinatorial logic stage, a third output value based on the first output value and the second output value.

In accordance with yet another aspect of the present disclosure, a device includes an operational data source, a test data source and a multiplexer. The multiplexer has a first input coupled to the operational data source, a second input coupled to the test data source, a third input to receive a bypass signal, and an output to provide one of a first data value representative of a value received at the first input or a second data value representative of a value received at the second input based on a value of the bypass signal. The multiplexer includes a latch stage having a first input coupled to the first input of the multiplexer, a second input coupled to receive the bypass signal, and an output coupled to the output of the multiplexer, wherein the multiplexer is configured so that there is only a two gate delay between the first input of the multiplexer and the output of the multiplexer via the latch stage.

FIGS. 1-5 illustrate exemplary techniques for implementing a latch bypass so that two separate data sources may be supplied to the same data path without introducing significant delay into the data path. In at least one embodiment, the latch bypass includes a multiplexer having an embedded latch configured so that no additional gate delays are introduced into the data path compared to a conventional single source latch path. For ease of illustration, the exemplary techniques disclosed herein are described in the context of a scheme for testing the data path downstream of a memory by enabling the insertion of test data in the place of operation data (e.g., data stored in the memory). However, using the guidelines provided herein, those skilled in the art can implement the latch bypass techniques described herein in other contexts without departing from the scope of the present disclosure.

Referring to FIG. 1, an exemplary combined memory processing/testing system is illustrated in accordance with at least one embodiment of the present disclosure. In the depicted example, the system 100 includes a memory 104, a test data source 106, a multiplexer 108 and a processing data path 110 integrated on a common substrate. The memory 104 stores operation data and can include, for example, a cache (e.g., a level 1 cache), a buffer, an embedded random access memory (RAM), a read only memory (ROM), and the like. The test data source 106 stores known test data and can include, for example, a register, a ROM, a set of programmable fuses, and the like. In at least one embodiment, the test data source 106 includes an output latch (not shown). The data path 110 includes components downstream from the multiplexer 108, the memory 104 and the test data source 106. The data path 110 can include, for example, a bus interface unit (BIU), a memory management unit (MMU), a processor or microcontroller, a peripheral interface, signal formatting or conditioning logic, a test interface, or a combination thereof.

It will be appreciated that values output by the memory 104 and the test data source 106 typically are output as sets of n bit values (e.g., n=8, 16, 32, etc.). However, for ease of discussion, the system 100 illustrates a latching and processing scheme for one bit, e.g., bit x, of the n bit values. The same latching and processing scheme is utilized for the each of the remaining n−1 bits.

The memory 104 includes an output to provide bit x of operation data (operation data[x] bit) stored at the memory 104 and the test data source 106 includes an output to provide bit x of test data (test data[x] bit). The multiplexer 108 includes a first input to receive the operation data[x] bit (i.e., the data signal 112) and a second input to receive the test data[x] bit (i.e., the data signal 114). The multiplexer 108 further includes a latch stage 116 to latch the operation data bit[x] and an output to provide a mux out[x] bit (i.e., the data signal 118), where the mux out[x] bit is selected from the latched operation data bit[x] and the test data[x] bit based on a bypass signal 115. In the illustrated example, when the bypass signal 115 is asserted, the test data[x] bit is output as the mux out[x] bit. Otherwise, the operation data[x] bit is output as the mux out[x] bit.

The data path 110 includes an input to receive the mux out[x] bit, a first output to provide test result data (e.g., text result[x] bit (signal 120)) when the mux out[x] bit is the test data[x] bit or processed data (e.g., processed data[x] bit (signal 122)) when the mux out[x] bit is the operation data[x] bit. It will be appreciated that although they are illustrated as separate data outputs, the test result data and the processed data may be the same data, where the difference is how the data output by the data path 110 is utilized or interpreted.

Thus, as illustrated above, the bypass signal 115 may be asserted or unasserted so as to implement a test mode or an operational mode, respectively, at the system 100. When in the operational mode, latched operation data from the memory 104 is provided to the data path 110 via the multiplexer 108 (and the latch stage 116). When in the test mode, test data from the test data source 106 is provided to the data path 110 via the multiplexer 108. As described in greater detail with reference to FIGS. 2-4, the multiplexer 108 may be implemented so that no additional gate delays are introduced by the multiplexing between the operation data and the test data in comparison to a conventional implementation of a conventional latch between the memory 104 and the data path 110 without any multiplexing.

Figure 2:
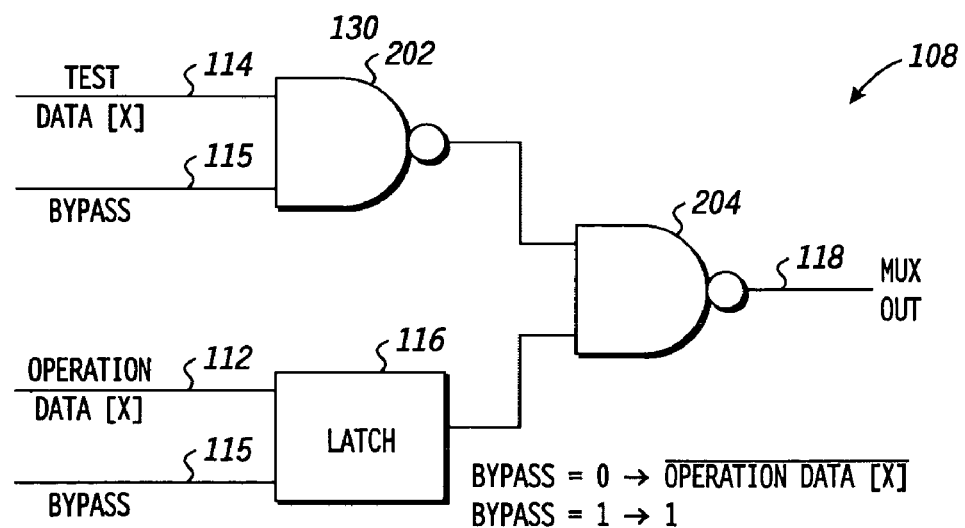
FIG. 2 is a diagram illustrating a multiplexer of the system of FIG. 1 in accordance with at least one embodiment of the present disclosure.

Referring to FIG. 2, the multiplexer 108 of FIG. 1 is illustrated in greater detail. In the depicted example, the multiplexer 108 includes a first and second combinatorial logic stages (e.g., NAND gates 202 and 204, respectively) and the latch stage 116. The latch stage 116 includes a first input to receive the operational data[x] bit (data signal 112), a second input to receive the bypass signal 115, and an output. In one embodiment, the latch stage 116 provides an asserted value (e.g., logic 1) when the bypass signal 115 is asserted (e.g., at logic 1) and provides a latched inverted representation of the operation data[x] bit when the bypass signal 115 is unasserted (e.g., at logic 0).

The NAND gate 202 includes a first input to receive the test data[x] bit (data signal 114), a second input to receive the bypass signal 115, and an output to provide a logic value representative of a NAND logic operation on the values at the first and second inputs. Thus, the output of the NAND gate 202 is a logic 1 when the bypass signal is unasserted and is an inverted representation of the test data[x] bit when the bypass signal is asserted.

The NAND gate 204 includes a first input coupled to the output of the NAND gate 202, a second input-coupled to the output of the latch stage 116, and an output to provide a logic value based on a NAND logic operation on the output of the NAND gate 202 and the output of the latch stage 116. Thus, the output value of the NAND gate 204 is the same as the value of the test data[x] bit when the bypass signal 115 is asserted and the output value of the NAND gate 204 is the same as the value of the latched operation data[x] bit when the bypass signal is unasserted.

Figure 3:
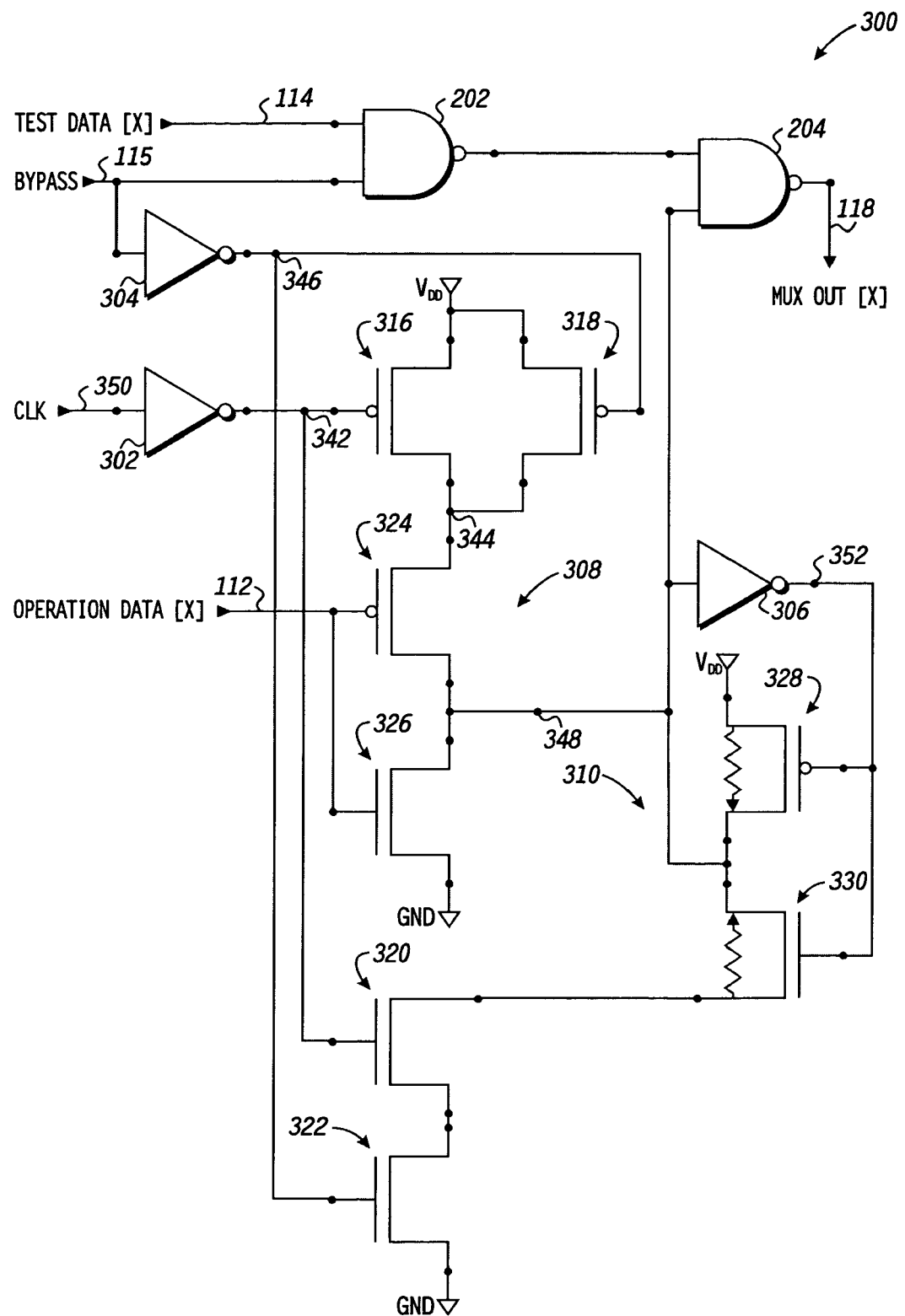
FIG. 3 is a circuit diagram illustrating an exemplary implementation of the multiplexer of FIG. 2 in accordance with at least one embodiment of the present disclosure.

Referring to FIG. 3, a circuit diagram illustrating an exemplary circuit 300 for implementing the multiplexer 108 of FIG. 2 is illustrated in accordance with at least one embodiment of the present disclosure. The circuit 300 includes the NAND gates 202 and 204. The circuit 300 further includes the latch stage 116 (FIG. 2), represented by inverters 302, 304, 306, 308 and 310, p-type transistors 316, 318, and n-type transistors 320 and 322. The inverter 308 includes a p-type transistor 324 and an n-type transistor 326. The inverter 310 includes a p-type transistor 328 and an n-type transistor 330.

The inverter 302 includes an input to receive a clock signal 350 and an output coupled to the node 342 to provide an inverted representation of the clock signal 350. The transistor 316 includes a first current-carrying electrode coupled to a first voltage source (e.g., $V_{DD}$), a second current-carrying electrode coupled to a node 344, and a control electrode coupled to the node 342. The transistor 318 includes a first current-carrying electrode coupled to the first voltage reference, a second current carrying electrode coupled to the node 344, and a control electrode coupled to a node 346. The transistor 324 of the inverter 308 includes a first current-carrying electrode coupled to the node 344, a second current-carrying electrode coupled to the node 348, and a control electrode to receive the data signal 112. The transistor 326 of the inverter 308 includes a first current-carrying electrode coupled to the node 348, a second current-carrying electrode coupled to a second voltage reference (e.g., ground or GND), and a control electrode to receive the data signal 112.

The inverter 304 includes an input to receive the bypass signal 115 and an output coupled to the node 346 to provide an inverted representation of the bypass signal 115. The NAND gate 202 includes a first input to receive the data signal 114, a second input to receive the bypass signal 115, and an output to provide the result of the NAND logic operation on the data signal 114 and the bypass signal 115. The NAND gate 204 includes a first input coupled to the output of the NAND gate 202, a second input coupled to the node 348, and an output to provide the result of the NAND logic operation on the output of the NAND gate 202 and the value at the node 348. The output of the NAND gate 204 represents the mux out[x] bit (data signal 118).

The inverter 306 includes an input coupled to the node 348 and an output coupled to the node 352 to provide an inverted representation of the value at the node 348. The transistor 328 of the inverter 310 includes a first current carrying electrode coupled to the first voltage reference, a second current carrying electrode coupled to the node 348, and a control electrode coupled to the node 352. The transistor 330 of the inverter 310 includes a first current carrying electrode coupled to the node 348, a second current carrying electrode, and a control electrode coupled to the node 352. The transistor 320 includes a first current carrying electrode coupled to the second current carrying electrode of the transistor 330, a second current carrying electrode, and a control electrode coupled to the node 342. The transistor 322 includes a first current carrying electrode coupled to the second current carrying electrode of the transistor 320, a second current carrying electrode coupled to the second voltage reference, and a control electrode coupled to the node 346.

In a test mode, the bypass signal 115 is asserted and, consequently, the NAND gate 202 provides an inverted representation of the test data[x] bit (data signal 114). Furthermore, an inverted representation of the bypass signal 115 enables a current path through the transistor 318 and the transistor 324 (operation data[x] is a logic low during test mode) that forces node 348 to a logic 1 value. Thus, the output of the NAND gate 204 provides an inverted representation of the output of the NAND gate 202. Hence, the assertion of the bypass signal 115 forces the mux out[x] bit to represent the value of the test data[x] bit.

Conventional latching schemes without multiplexing typically introduce a two-gate delay between the memory output and the downstream data path. When the circuit 300 of FIG. 3 is in operational mode, one gate delay is incurred at the inverter 308 and another gate delay is incurred at the NAND gate 204 for a total of two gate delays. When the circuit 300 is in test mode, one gate delay is incurred at the NAND gate 202 and one gate delay is incurred at the NAND gate 204. Thus, the circuit 300 also introduces only a two-gate delay between the inputs of data signals 112 and 114 and the corresponding output of signal 118 regardless of whether the circuit 300 is operating in test mode or operational mode.

Figure 4:
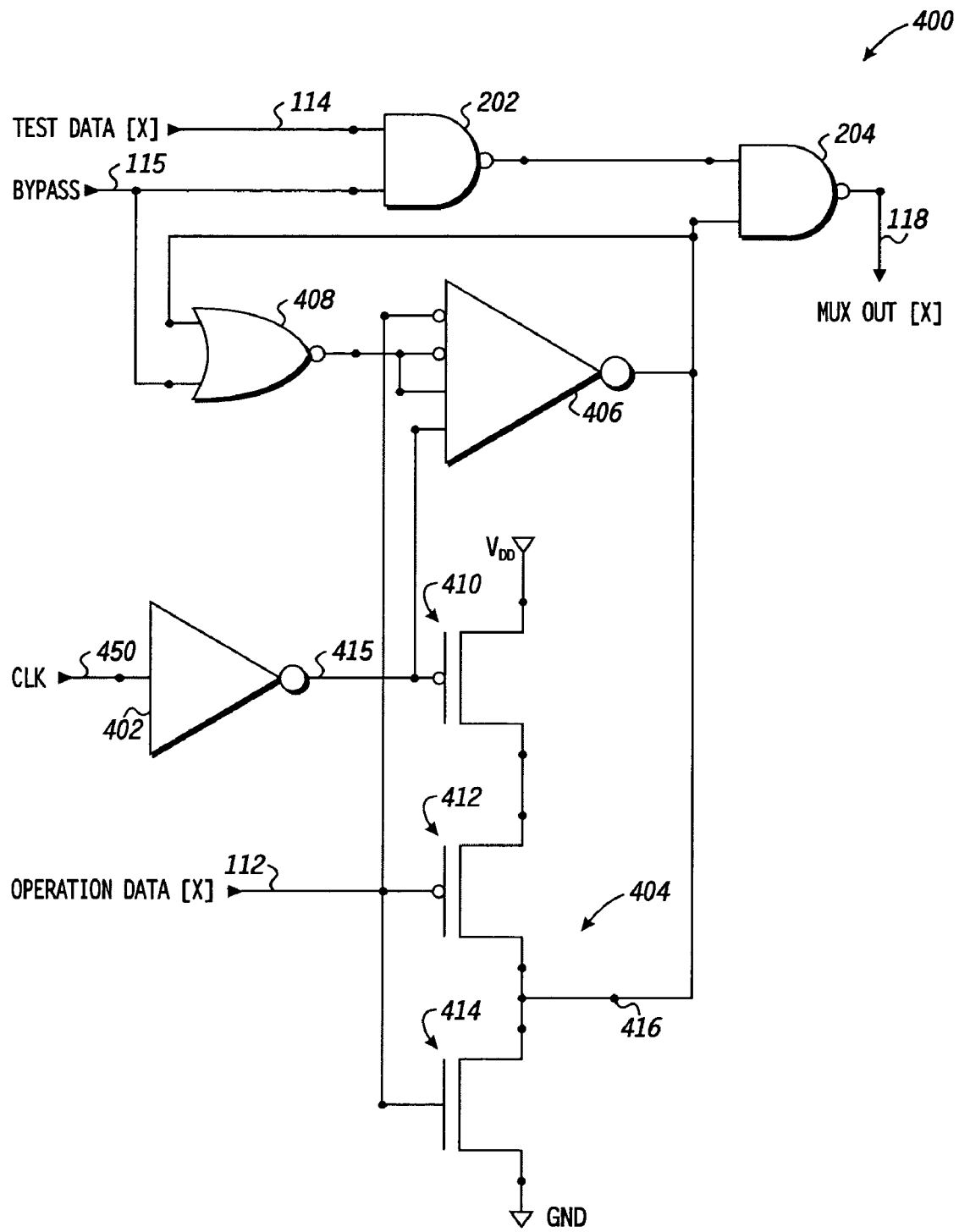
FIG. 4 is a circuit diagram illustrating another exemplary implementation of the multiplexer of FIG. 2 in accordance with at least one embodiment of the present disclosure.

Referring to FIG. 4, a circuit diagram illustrating another exemplary circuit 400 for implementing the multiplexer 108 of FIG. 2 is illustrated in accordance with at least one embodiment of the present disclosure. The circuit 400 includes the NAND gates 202 and 204. The circuit 400 further includes the latch stage 116 represented by inverters 402, 404 and 406, a NOR gate 408 and a p-type transistor 410. The inverter 404 includes a p-type transistor 412 and an n-type transistor 414.

The inverter 402 includes an input to receive a clock signal 450 and an output coupled to a node 415 to provide an inverted representation of the clock signal 450. The transistor 410 includes a first current carrying electrode coupled to a first voltage reference (e.g., $V_{DD}$), a second current carrying electrode, and a control electrode coupled to the node 415. The transistor 412 includes a first current carrying electrode coupled to the second current carrying electrode of the transistor 410, a second current carrying electrode coupled to a node 416, and a control electrode to receive the data signal 112 (operation data[x] bit). The transistor 414 includes a first current carrying electrode coupled to the node 416, a second current carrying electrode coupled to a second voltage reference (e.g., ground or GND), and a control electrode to receive the data signal 112.

The NOR gate 408 includes a first input to receive the bypass signal 115, a second input coupled to the node 416, and an output to provide the result of a NOR logic operation on the bypass signal 115 and the value at the node 416. The inverter 406 includes a first input coupled to the output of the NOR gate 408 and an output to provide an inverted representation of the output value of the NOR gate 408. The inverter 406 further may be responsive to a second input to receive the data signal 112 and a third input coupled to the node 415 to receive the inverted representation of the clock signal 450.

The NAND gate 202 includes a first input to receive the data signal 114 (the test data[x] bit), a second input to receive the bypass signal 115, and an output to provide the result of the NAND logic operation on the data signal 114 and the bypass signal 115. The NAND gate 204 includes a first input coupled to the output of the NAND gate 202, a second input coupled to the node 416, and an output to provide the result of the NAND logic operation on the output value of the NAND gate 202 and the value at the node 416 as the data signal 118 (mux out[x] bit).

In an operational mode, the bypass signal 115 is unasserted, thereby causing the output of the NAND gate 202 to remain asserted, in turn causing the NOR gate 408 to act as an inverter, which, in conjunction with the inverter 406, acts as the storage cell of a latch. Likewise, the asserted output of the NAND gate 202 causes the NAND gate 204 to act as an inverter by outputting an inverted representation of the value at the node 416 (i.e., the inverted latched operation data[x] bit) as the data signal 118. In a test mode, the bypass signal 115 is asserted, thereby forcing the output of the NOR gate 408 to a logic 0 (operation data[x] is a logic low during test mode) and the output of the inverter 406 to a logic 1. Hence, node 416 is at a logic 1 and the output of the NAND gate 204 is an inverted representation of the output of the NAND gate 202. In turn, the output of the NAND gate 202 is an inverted representation of the test data[x] bit when the bypass signal 115 is asserted. Thus, the assertion of the bypass signal 115 forces the mux out[x] bit to have the same value as the test data[x] bit.

As with the circuit 300 of FIG. 3, the circuit 400 introduces only two gate delays between the data signals 112 and 114 and the data signal 118 regardless of whether the circuit 400 is in an operational mode or test mode. To illustrate, one gate delay occurs at the inverter 404 and another gate delay occurs at the NAND gate 204 when in the operational mode. Likewise, one gate delay occurs at the NAND gate 202 and another gate delay occurs at the NAND gate 204 when in the test mode.

Figure 5:
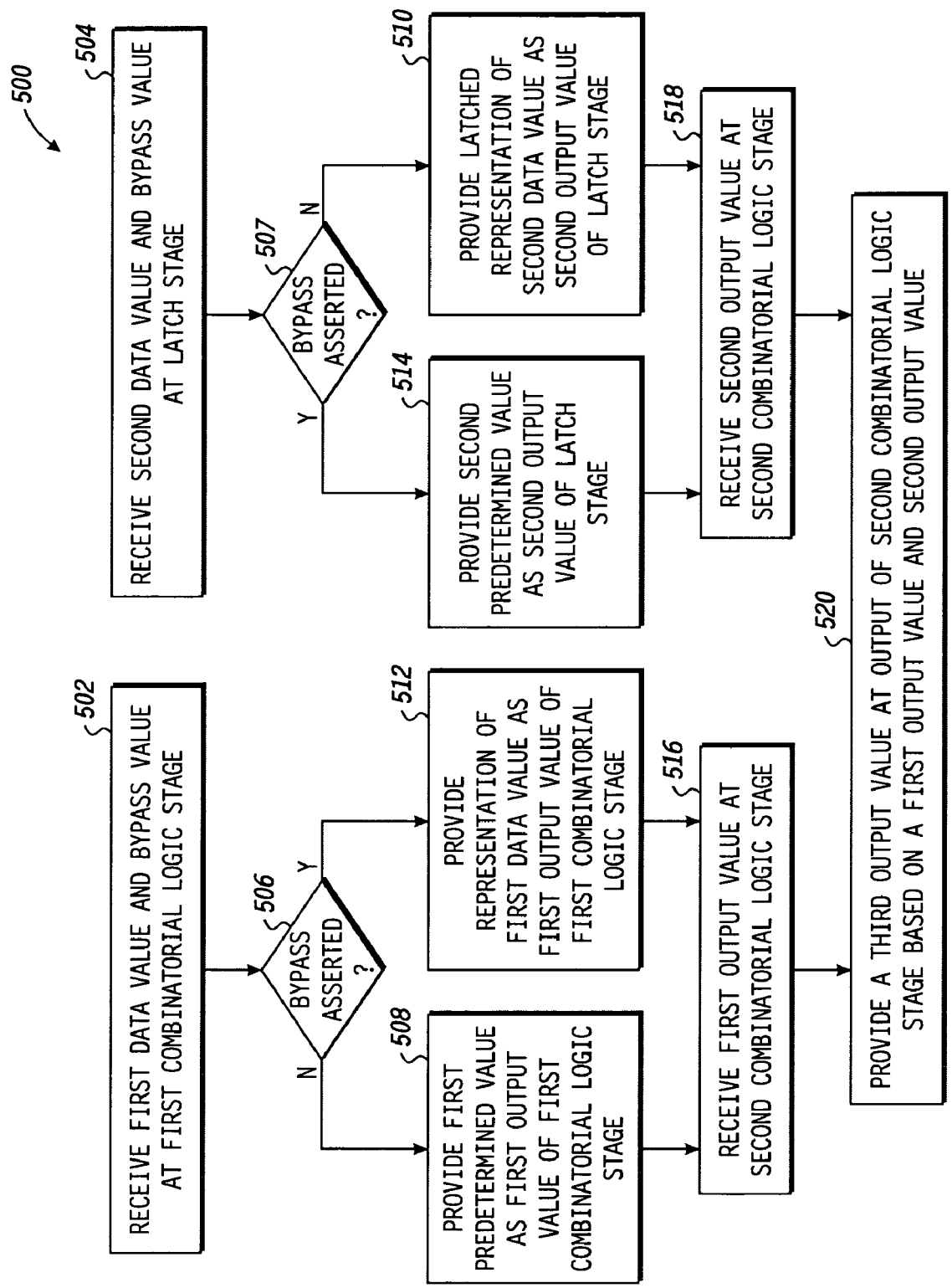
FIG. 5 is a flow diagram illustrating an exemplary method for multiplexing latched operation data and test data in accordance with at least one embodiment of the present disclosure.

Referring to FIG. 5, an exemplary method 500 for flush-through latching with two data inputs is illustrated in accordance with at least one embodiment of the present disclosure. The method 500 includes receiving a first data value and a bypass value at a first combinatorial logic stage of an electronic device at block 502 and receiving a second data value and the bypass value at a latch stage of the electronic device at block 504. The first combinatorial logic stage can include, for example, a NAND logic stage. The first data value includes, for example, a test value and the second data value includes, for example, operation data from a memory.

The method 500 further includes determining whether the bypass value is asserted at decision blocks 506 and 507. If unasserted, the method 500 includes providing a first predetermined value as a first output of the first combinatorial logic stage at block 508 and providing a latched representation of the second data value as a second output value of latch stage at block 510. The latched representation of the second data value can include, for example, a latched inverted representation of the second data value. If the bypass value is asserted, the method 500 includes providing a representation of the first data value as the first output value of the first combinatorial logic stage at block 512 and providing a second predetermined value as the second output value of the latch stage at block 514. In at least one embodiment, the first predetermined value and the second predetermined value are the same value (e.g., a logic 1).

The method 500 further includes receiving the first output value at a second combinatorial logic stage of the electronic device at block 516 and receiving the second output value at the second combinatorial logic stage at block 518. At block 520, the method 500 includes providing a third output value at the output of the second combinatorial logic stage based on the first output value and the second output value. To illustrate, the second combinatorial logic stage can include, for example, a NAND logic stage that performs a NAND logic operation on the first and second output values to generate the third output value.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A device comprising:
    a first combinatorial logic stage having a first input to receive a first data value, a second input to receive a bypass value and an output to provide one of a representation of the first data value or a first predetermined value based on the bypass value;
    a latch stage having a first input to receive a second data value, a second input to receive the bypass value and an output to provide one of a latched representation of the second data value or a second predetermined value based on the bypass value, the latch stage further comprising:
        a NOR logic stage having a first input to receive the bypass value, a second input to receive a representation of the second data value, and an output; and
        an inverter logic stage having an input coupled to the output of the NOR logic stage and an output coupled to the second input of the NOR logic stage and the second input of the second combinatorial logic stage; and
    a second combinatorial logic stage having a first input coupled to the output of the first combinatorial logic stage, a second input coupled to the output of the latch stage, and an output.

2. The device of claim 1, wherein the first predetermined value and the second predetermined value are the same value.

3. The device of claim 1, wherein the first and second combinatorial logic stages comprise NAND logic stages.

4. The device of claim 1, wherein:
    when the bypass value is asserted:
        the output of the first combinatorial logic stage provides the representation of the first data value; and
        the output of the latch stage provides the second predetermined value; and when the bypass value is not asserted:
        the output of the first combinatorial logic stage provides the first predetermined value; and
        the output of the latch stage provides a latched representation of the second data value.

5. The device of claim 1, wherein the first data value comprises a bit value of test data and the second data value comprises a bit value of operation data.

6. A device comprising:
    a first combinatorial logic stage having a first input to receive a first data value, a second input to receive a bypass value and an output to provide one of a representation of the first data value or a first predetermined value based on the bypass value;
    a latch stage having a first input to receive a second data value, a second input to receive the bypass value and an output to provide one of a latched representation of the second data value or a second predetermined value based on the bypass value;
    a second combinatorial logic stage having a first input coupled to the output of the first combinatorial logic stage, a second input coupled to the output of the latch stage, and an output; and
    the latch stage further comprising:
        a first voltage reference;
        a second voltage reference;
        a first transistor having a first current-carrying electrode coupled to the first voltage reference, a second current-carrying electrode coupled to a first node, and a control electrode to receive a clock signal;
        a second transistor having a first current-carrying electrode coupled to the first voltage reference, a second current-carrying electrode coupled to the first node, and a control electrode to receive a representation of the bypass value;
        a third transistor having a first current-carrying electrode coupled to the first node, a second current-carrying electrode coupled to a second node and a control electrode to receive the second data value;
        a fourth transistor having a first current-carrying electrode coupled to the second voltage reference, a second current carrying electrode coupled to the second node and a control electrode to receive the second data value;
        a first inverter stage having an input coupled to the second node and an output;

a second inverter stage having an input coupled to the output of the first inverter stage and an output coupled to the second node; and wherein the second node comprises the output of the latch stage.

7. The device of claim 6, wherein the first, second and third transistors comprise p-type transistors and the fourth transistor comprises an n-type transistor.

8. A method comprising:
receiving, at a first combinatorial logic stage, a first data value and a bypass value;
receiving, at a latch stage, a second data value and the bypass value;
providing, at an output of the first combinatorial logic stage, a first output value comprising one of a representation of the first data value or a first predetermined value based on the bypass value;
providing, at an output of the latch stage, a second output value comprising one of a latched representation of the second data value or a second predetermined value based on the bypass value;
receiving, at a second combinatorial logic stage, the first output value and the second output value; and
providing, at an output of the second combinatorial logic stage, a third output value based on the first output value and the second output value;
wherein receiving, at the latch stage, the second data value and the bypass value comprises:
receiving, at a NOR logic stage of the latch stage, the bypass value and the second data value; and
providing a fourth output value at an output of the NOR logic stage based on the bypass value and the second data value; and
wherein providing, at the output of the latch stage, the second output value comprises:
receiving, at an inverter of the latch stage, the fourth output value; and
providing a fifth output value at an output of the inverter, the fifth output value comprising a representation of the fourth output value, and wherein the second output value comprises the fifth output value.

9. The method of claim 8, wherein the first predetermined value and the second predetermined value are the same value.

10. The method of claim 8, wherein the first and second combinatorial logic stages comprise NAND logic stages.

11. The method of claim 10, wherein:
the first output value comprises a representation of the first data value and the second output value comprises the second predetermined value when the bypass value is asserted; and
the first output value comprises the first predetermined value and the second output value comprises the latched representation of the second data value when the bypass value is not asserted.

12. The method of claim 8, wherein the first data value comprises a bit value of test data and the second data value comprises a bit value of operation data.

13. The method of claim 8, wherein only two gate delays occur between receiving, at the latch stage, the second data value and the bypass value and providing, at an output of the second combinatorial logic stage, a third output value based on the first output value and the second output value.

14. A device comprising:
an operational data source;
a test data source; and
a multiplexer having a first input coupled to the operational data source, a second input coupled to the test data source, a third input to receive a bypass signal, and an output to provide one of a first data value representative of a value received at the first input or a second data value representative of a value received at the second input based on a value of the bypass signal, wherein the multiplexer comprises a latch stage having a first input coupled to the first input of the multiplexer, a second input coupled to receive the bypass signal, and an output coupled to the output of the multiplexer, wherein the multiplexer is configured so that there is only a first two gate delay between the first input of the multiplexer and the output of the multiplexer via the latch stage and there is only a second two gate delay between the second input and the output of the multiplexer, the first two gate delay comprising a first combinatorial logic stage and a second combinatorial logic stage and the second two gate delay comprising a transistor configuration and the second combinatorial logic stage.

15. The device of claim 14, wherein the multiplexer comprises:
the first combinatorial logic stage having a first input to receive the first data value, a second input to receive the bypass signal and an output to provide one of a representation of the first data value or a first predetermined value based on the bypass signal;
a latch stage having a first input to receive the second data value, a second input to receive the bypass value and an output to provide one of a latched representation of the second data value and a second predetermined value based on the bypass signal; and
the second combinatorial logic stage having a first input coupled to the output of the first combinatorial logic stage, a second input coupled to the output of the latch stage, and an output.

16. The device of claim 15, wherein the latch stage comprises:
a first voltage reference;
a second voltage reference;
a first transistor having a first current-carrying electrode coupled to the first voltage reference, a second current-carrying electrode coupled to a first node, and a control electrode to receive a clock signal;
a second transistor having a first current-carrying electrode coupled to the first voltage reference, a second current-carrying electrode coupled to the first node, and a control electrode to receive a representation of the bypass signal;
a third transistor having a first current-carrying electrode coupled to the first node, a second current-carrying electrode coupled to a second node and a control electrode to receive the second data value;
a fourth transistor having a first current-carrying electrode coupled to the second voltage reference, a second current carrying electrode coupled to the second node and a control electrode to receive the second data value;
a first inverter stage having an input coupled to the second node and an output;
a second inverter stage having an input coupled to the output of the first inverter stage and an output coupled to the second node; and
wherein the second node comprises the output of the latch stage.

17. The device of claim 15, wherein the latch stage comprises:

a NOR logic stage having a first input to receive the bypass value, a second input to receive a representation of the second data value, and an output; and an inverter logic stage having an input coupled to the output of the NOR logic stage and an output coupled to the second input of the NOR logic stage and the second input of the second combinatorial logic stage.

18. The device of claim 6, wherein the first and second combinatorial logic stages comprise NAND logic stages.

19. The device of claim 6, wherein:

when the bypass value is asserted:

the output of the first combinatorial logic stage provides the representation of the first data value; and the output of the latch stage provides the second predetermined value; and when the bypass value is not asserted:

the output of the first combinatorial logic stage provides the first predetermined value; and the output of the latch stage provides a latched representation of the second data value.

20. The device of claim 6, wherein the first data value comprises a bit value of test data and the second data value comprises a bit value of operation data.

* * * * *